(12) United States Patent
Wu et al.

(10) Patent No.: US 9,716,090 B2
(45) Date of Patent: Jul. 25, 2017

(54) FINFET STRUCTURE

(71) Applicant: TAIWAN SEMICONDUCTOR MANUFACTURING COMPANY LTD., Hsinchu (TW)

(72) Inventors: Cheng-Ta Wu, Chiayi County (TW); Cheng-Wei Chen, Tainan (TW); Hong-Yi Wu, Hsinchu (TW); Shiu-Ko Jangjian, Tainan (TW); Wei-Ming You, Taipei (TW); Ting-Chun Wang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/193,628

(22) Filed: Jun. 27, 2016

(65) Prior Publication Data
US 2016/0307895 A1    Oct. 20, 2016

Related U.S. Application Data

(62) Division of application No. 14/658,511, filed on Mar. 16, 2015, now Pat. No. 9,406,675.

(51) Int. Cl.
*H01L 27/088* (2006.01)
*H01L 29/66* (2006.01)
(Continued)

(52) U.S. Cl.
CPC ...... *H01L 27/0886* (2013.01); *H01L 21/0257* (2013.01); *H01L 21/0262* (2013.01); *H01L 21/02532* (2013.01); *H01L 21/02592* (2013.01); *H01L 21/02595* (2013.01); *H01L 21/02609* (2013.01); *H01L 21/02667* (2013.01); *H01L 21/28035* (2013.01); *H01L 21/28088* (2013.01); *H01L 21/76224* (2013.01);
(Continued)

(58) Field of Classification Search
CPC ............. H01L 27/0886; H01L 29/0653; H01L 29/42364; H01L 29/66795; H01L 21/0257; H01L 21/02532; H01L 21/02609; H01L 21/02667; H01L 21/2633; H01L 21/28185; H01L 21/823462
USPC ... 257/280, 347, 368, 401, E27.06, E29.152, 257/E29.255, E21.409, E21.628; 438/283, 296, 299, 690
See application file for complete search history.

(56) References Cited

U.S. PATENT DOCUMENTS

| | | | |
|---|---|---|---|
| 7,667,271 | B2 | 2/2010 | Yu et al. |
| 8,298,925 | B2 | 10/2012 | Wu et al. |

(Continued)

OTHER PUBLICATIONS

Notice of Allowance dated Jan. 20, 2017 of the corresponding Taiwan application 104138919.
(Continued)

*Primary Examiner* — Dao H Nguyen
(74) *Attorney, Agent, or Firm* — WPAT, P.C., Intellectual Property Attorneys; Anthony King

(57) ABSTRACT

A FinFET structure includes a substrate, a plurality of stripes, a metal gate and an oxide material. The stripes are on the substrate. The metal gate is on a sidewall and a top surface of one of the stripes. The oxide material is between the metal gate and the stripes. An average roughness of an interface between the metal gate and the oxide material is in a range of from about 0.1 nm to about 0.2 nm.

20 Claims, 19 Drawing Sheets

(51) Int. Cl.
*H01L 29/788* (2006.01)
*H01L 21/8234* (2006.01)
*H01L 21/02* (2006.01)
*H01L 21/28* (2006.01)
*H01L 21/762* (2006.01)
*H01L 29/04* (2006.01)
*H01L 29/06* (2006.01)
*H01L 21/265* (2006.01)

(52) U.S. Cl.
CPC ........ *H01L 21/823431* (2013.01); *H01L 21/823437* (2013.01); *H01L 21/823462* (2013.01); *H01L 21/823481* (2013.01); *H01L 29/045* (2013.01); *H01L 29/0649* (2013.01); *H01L 29/66545* (2013.01); *H01L 29/66795* (2013.01); *H01L 21/26506* (2013.01)

(56) References Cited

U.S. PATENT DOCUMENTS

| | | | |
|---|---|---|---|
| 8,362,575 B2 | 1/2013 | Kwok et al. | |
| 8,367,498 B2 | 2/2013 | Chang et al. | |
| 8,440,517 B2 | 5/2013 | Lin et al. | |
| 8,497,528 B2 | 7/2013 | Lee et al. | |
| 8,610,240 B2 | 12/2013 | Lee et al. | |
| 8,680,576 B2 | 3/2014 | Ching et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 2004/0266115 A1* | 12/2004 | Chan | H01L 29/42384 438/284 |
| 2010/0093179 A1* | 4/2010 | Hori | H01L 21/02238 438/723 |
| 2010/0163926 A1 | 7/2010 | Hudait | |
| 2011/0068407 A1 | 3/2011 | Yeh et al. | |
| 2013/0011983 A1 | 1/2013 | Tsai et al. | |
| 2014/0252412 A1 | 9/2014 | Tsai et al. | |
| 2015/0099360 A1* | 4/2015 | Yieh | H01L 21/82346 438/690 |
| 2015/0162438 A1* | 6/2015 | Chou | H01L 29/66825 257/321 |
| 2016/0218043 A1* | 7/2016 | Basker | H01L 29/7856 |

OTHER PUBLICATIONS

Search report dated Jan. 20, 2017 of the corresponding Taiwan application 104138919.

* cited by examiner

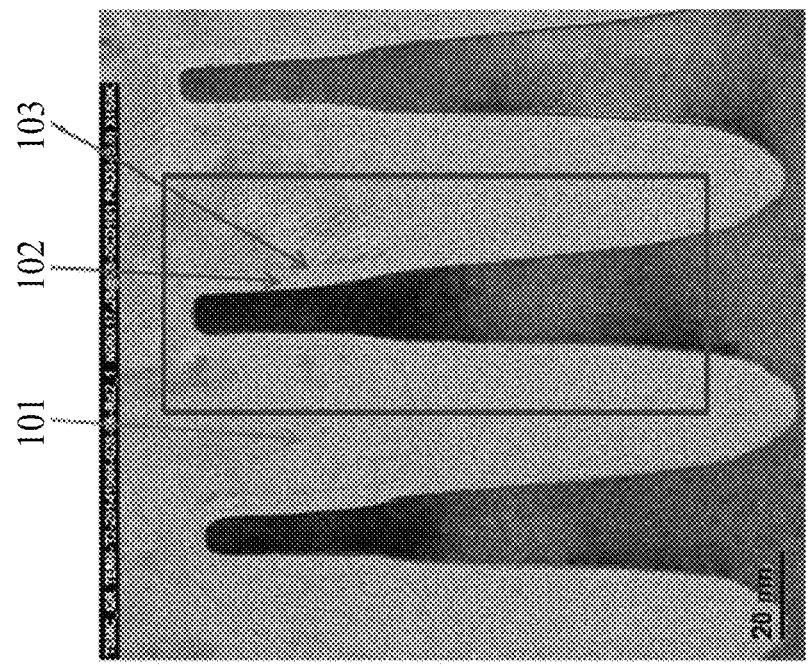
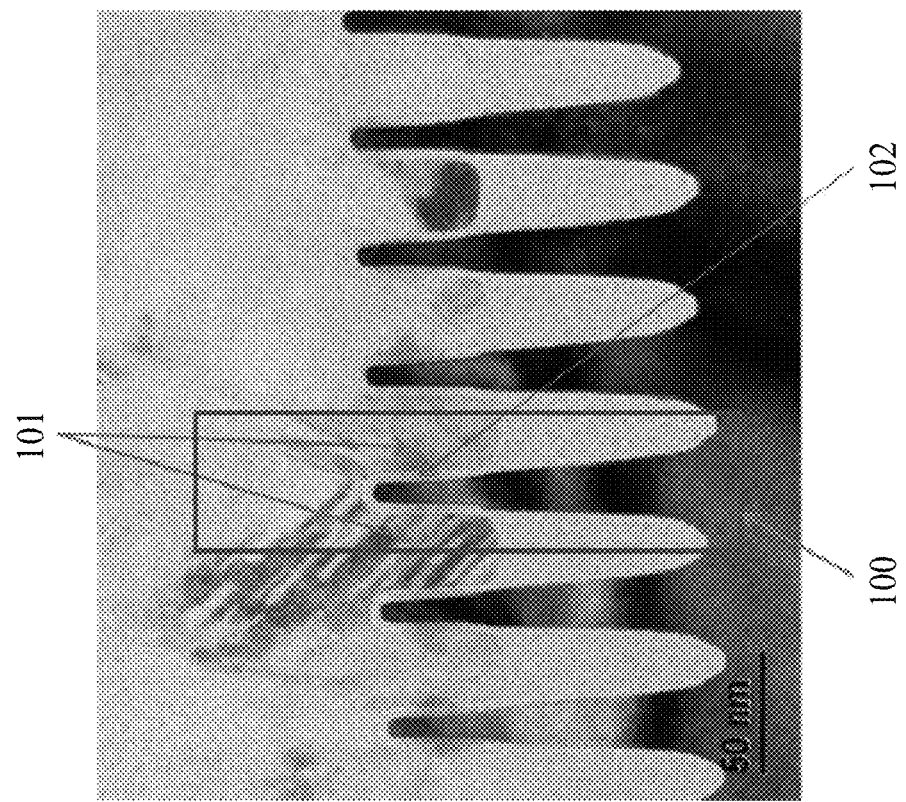
FIG. 1B
FIG. 1A

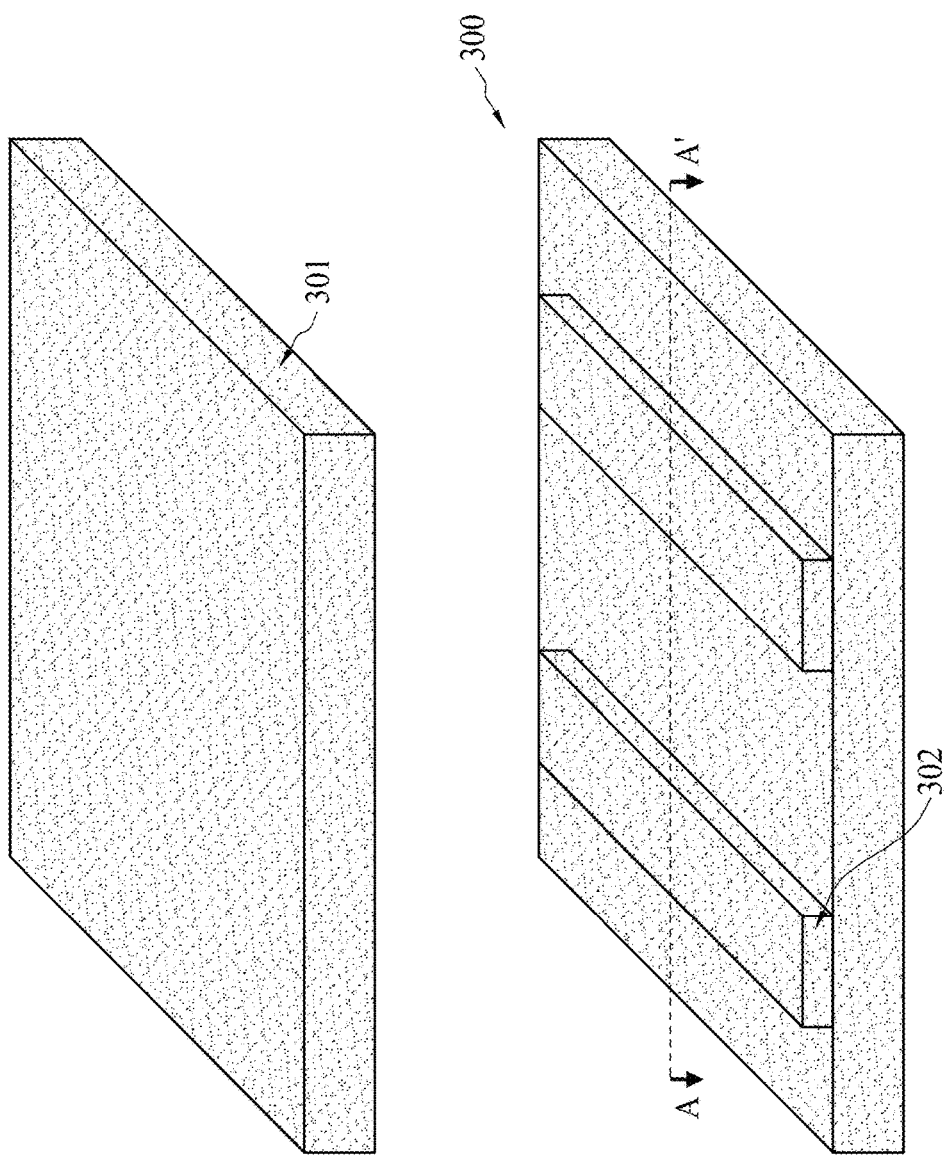

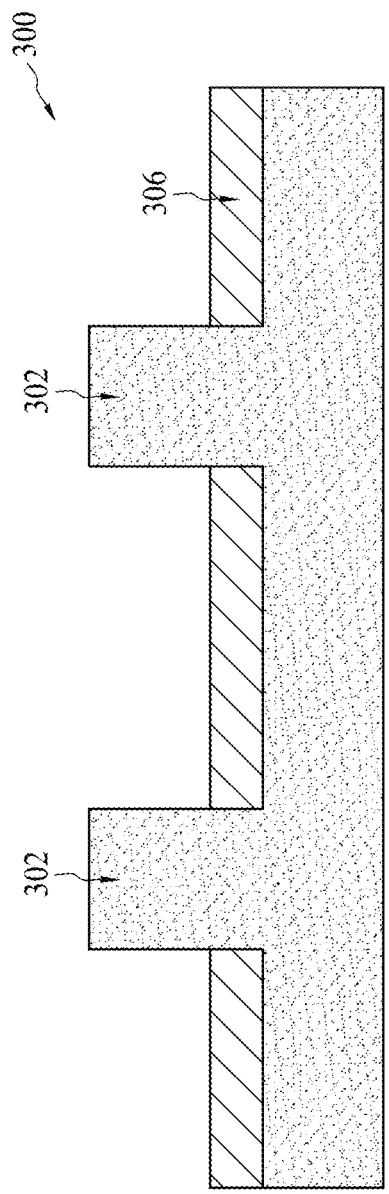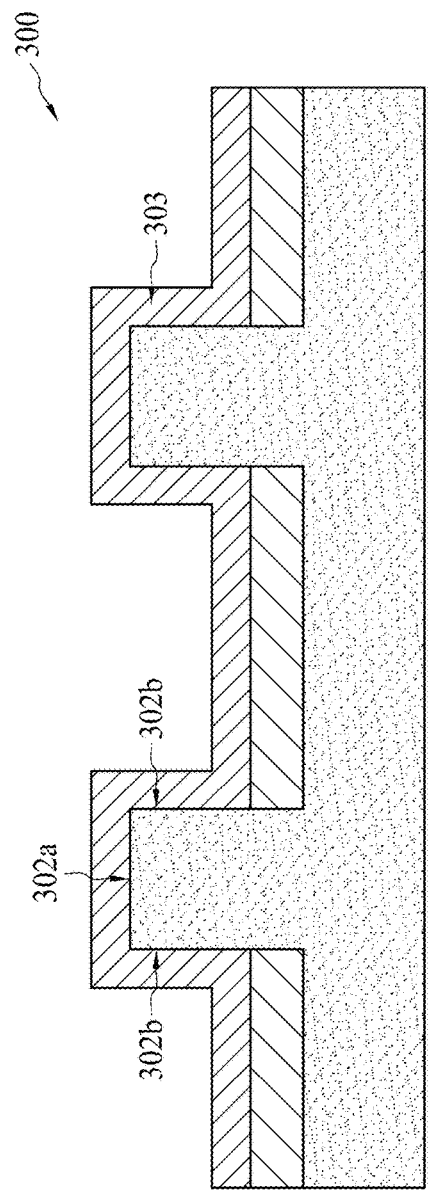
FIG. 3C
FIG. 3D

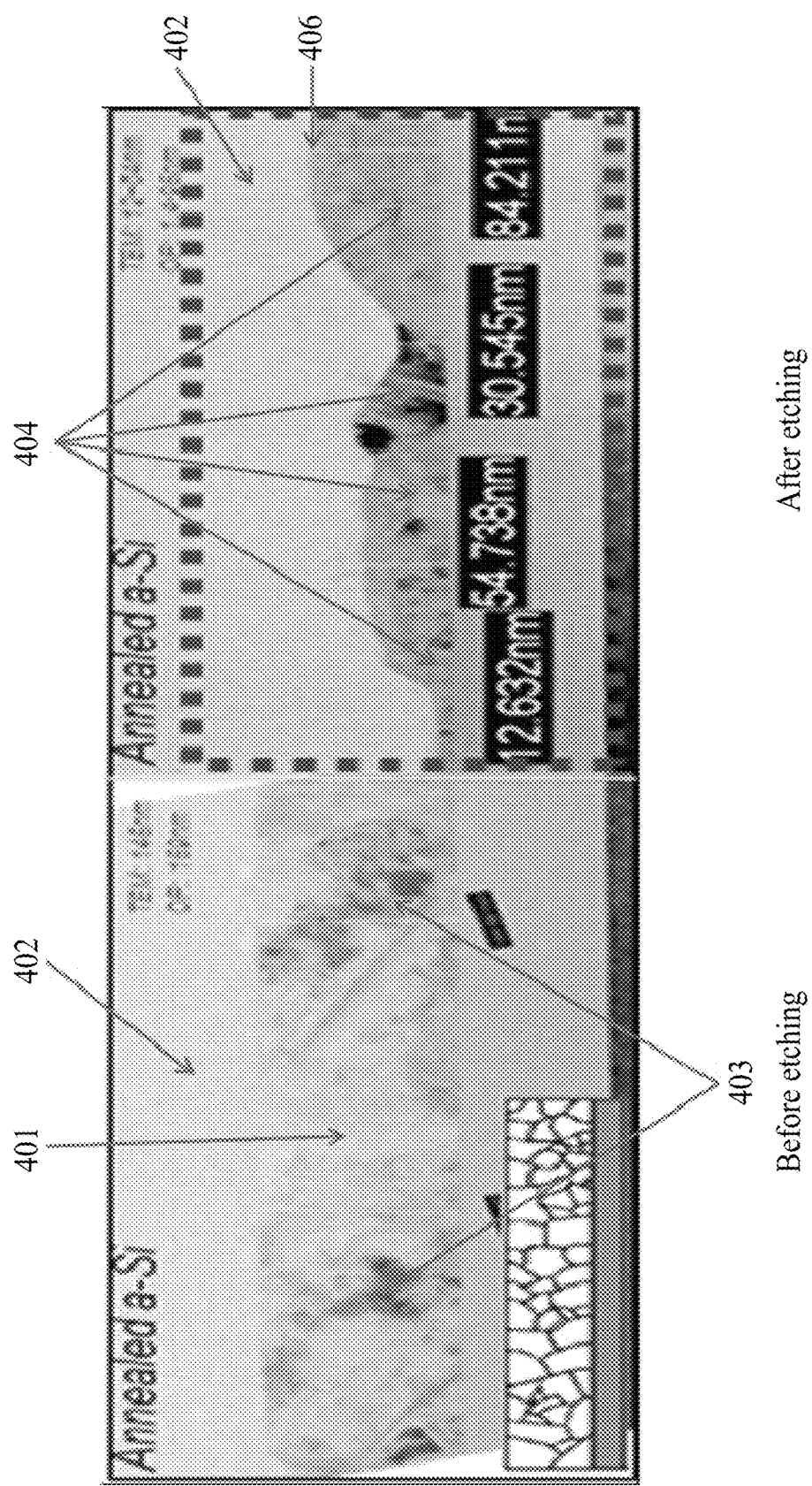
FIG. 4C  Before etching
FIG. 4D  After etching

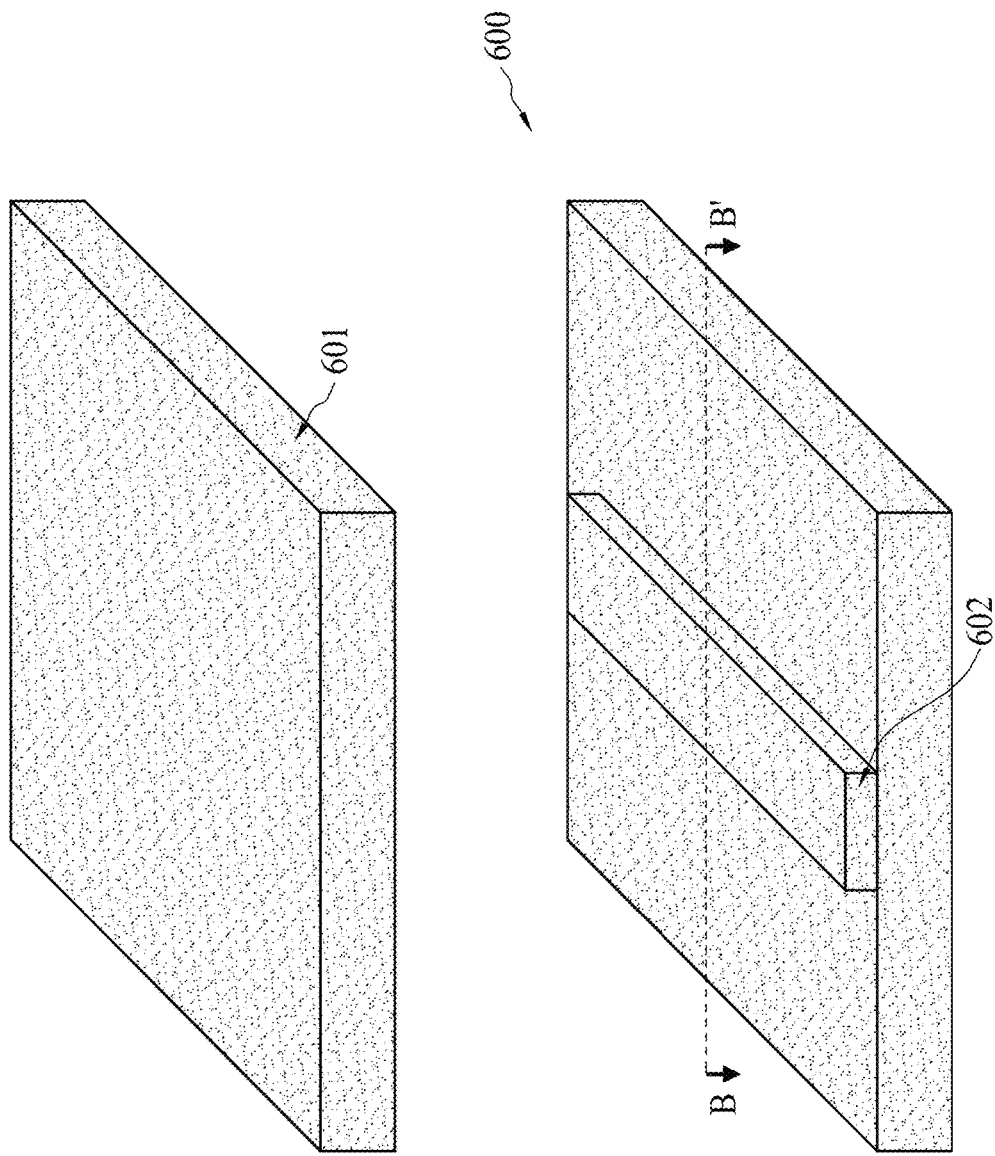

FINFET STRUCTURE

CROSS-REFERENCE TO RELATED APPLICATIONS

This application is a divisional of U.S. application Ser. No. 14/658,511, filed Mar. 16, 2015.

FIELD

The disclosure relates to a FinFET structure.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs Such scaling down has also increased the complexity of processing and manufacturing ICs and, for these advances to be realized, similar developments in IC processing and manufacturing are needed. For example, a three dimensional transistor, such as a FinFET, has been introduced to replace a planar transistor. Although existing FinFET devices and methods of fabricating FinFET devices have been generally adequate for their intended purposes, they have not been entirely satisfactory in all respects. For example, an irregular interface between a gate oxide and a metal gate of a FinFET raises challenges in a FinFET process development. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion FIG. 1A is a cross sectional view of a conventional Fin Field Effect Transistor (FinFET) structure after an anneal operation greater than 700 degrees Celsius;

FIG. 1B is an enlarged cross sectional view of a conventional Fin Field Effect Transistor (FinFET) structure after an anneal operation greater than 700 degrees Celsius;

FIGS. 3A-3E show fragmental cross sectional views of various operations for manufacturing a FinFET structure in accordance with some embodiments of the present disclosure;

FIG. 4C shows a cross sectional view of polysilicon (annealed amorphous silicon) before an etching operation;

FIG. 4D shows a cross sectional view of polysilicon (annealed amorphous silicon) after an etching operation;

FIGS. 6A-6D show fragmental cross sectional views of various operations for manufacturing a FinFET structure in accordance with some embodiments of the present disclosure;

DETAILED DESCRIPTION OF THE INVENTION

Figure 2:
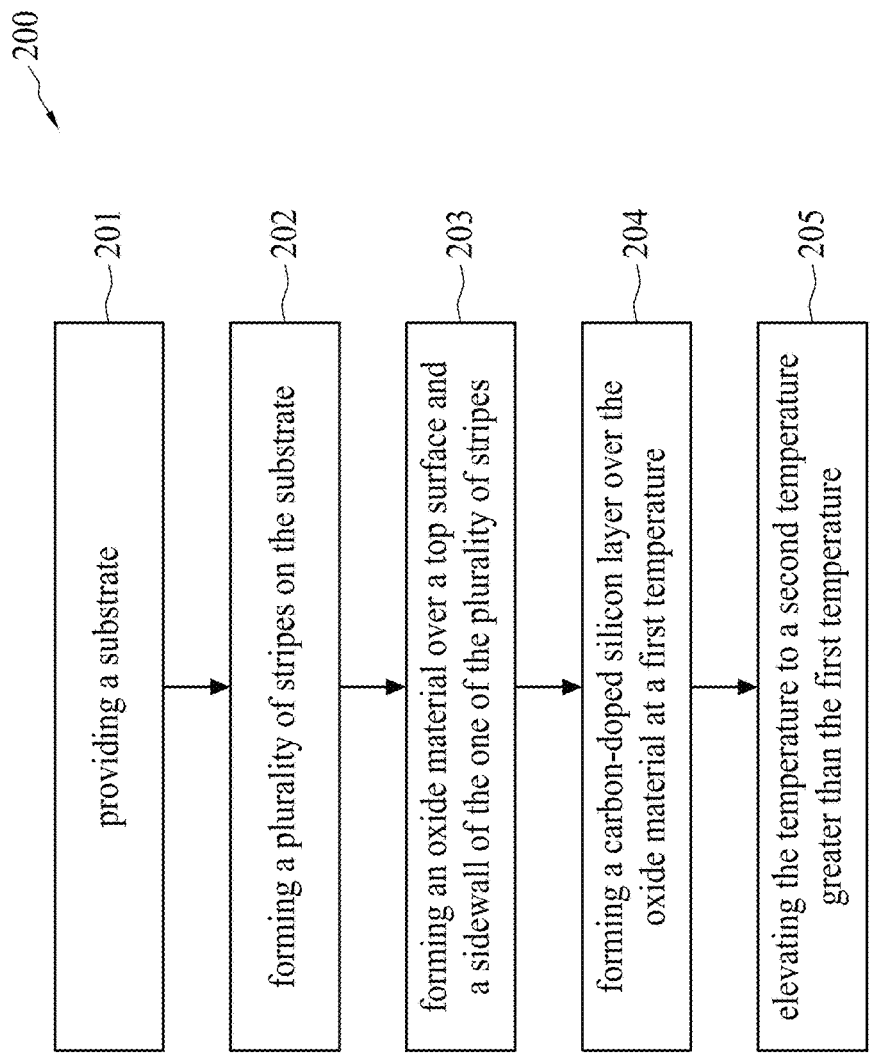
FIG. 2 is a flow chart of forming a FinFET structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the conventional operation of manufacturing a FinFET device, an un-doped silicon layer is formed after forming a gate oxide on a gate of a FinFET device. The un-doped silicon layer is formed under a lower temperature (e.g. about 530 degrees Celsius) compared to some operations subsequent to forming the un-doped silicon layer. However, during the operation with higher temperatures, grains with different orientations are formed at various locations in the silicon layer including at an interface between the gate oxide and the un-doped silicon layer of the FinFET structure. The un-doped silicon layer is prone to recrystallize under a temperature higher than about 700 degrees Celsius. The volume of the recrystallized un-doped silicon layer is greater than that of the silicon layer without recrystallization. Said volume expansion generates greater roughness at the interface between the gate oxide and the silicon layer, and said roughness carries to the final product between the gate oxide and the metal gate. The volume expansion of the recrystallized silicon layer also deteriorates the dimension uniformity of the metal gate, and thus impacts the performance thereof. Furthermore, the roughness between the metal gate and gate oxide leads to greater leakage current in the FinFET device with metal gate.

FIG. 1A shows a cross section of a plurality of fins 100 after an annealing operation. The recrystallized a poly silicon layer 101 is formed over gate oxide 102 of a fin 100. FIG. 1B is an enlarged cross section of the interface 103 between the gate oxide 102 and the polysilicon layer 101 after the polysilicon layer 101 recrystallized. The shape of the interface 103 between the gate oxide 102 and the polysilicon layer 101 is irregular. In some embodiments, the roughness of the interface 103 between the gate oxide 102 and the polysilicon layer 101 may impact the performance of a FinFET.

Figure 3E:
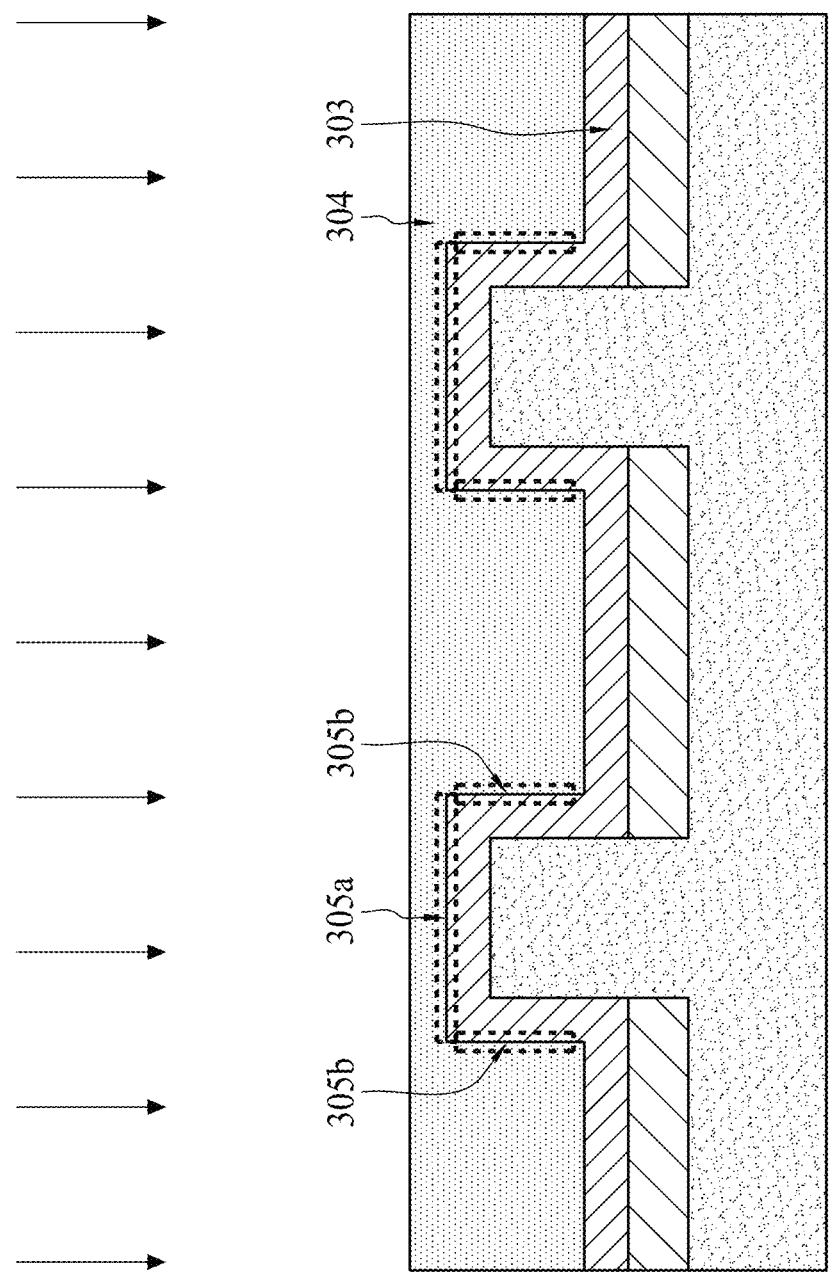

For reducing the recrystallization of the silicon layer, a flow chart of a method 200 of introducing a carbon-doped silicon layer in the process of forming a FinFET device is shown in FIG. 2. The method 200 includes a number of operations. Referring to FIG. 2 to FIG. 3E, in operation 201, a substrate 301 is provided as in FIG. 3A. In some embodiments, the substrate comprises silicon. In operation 202, a plurality of stripes 302 are formed on the substrate 301 as shown in FIG. 3B. The material of the plurality of stripes 302 are usually the same as that of the substrate 301. FIG. 3C is a cross-sectional view illustrating in detail the FinFET structure 300 of FIG. 3B, wherein the exemplary cross-sectional view is obtained by dissecting line A-A' in FIG. 3B. The FinFET structure 300 includes a substrate 301 and a plurality of stripes 302. Isolations 306 are formed over the substrate 301, as shown in FIG. 3C. In operation 203, an oxide material 303 is formed over the plurality of stripes 302 and the isolations 306, as shown in FIG. 3D.

In operation 204, a silicon layer 304 is formed over the oxide material 303 at a first temperature as shown in FIG. 3E. The silicon layer 304 is deposited over the stripes 302. During the formation of the silicon layer 304, the silicon layer 304 is implanted with carbon at a concentration of from about $5E19/cm^3$ to about $1E22/cm^3$. In some embodiments, the silicon layer 304 is formed under a first temperature from about 450 degrees Celsius to about 650 degrees Celsius, typically from 480 degrees Celsius to 620 degrees Celsius. In some embodiments, the silicon layer 304 is formed under a pressure from about 0.2 torr to about 5.0 torr.

Gases comprising $SiH_4$, $C_2H_4$ or $H_2$ are also introduced during the formation of the silicon layer 304. The doping operation of the silicon layer being formed concurrently with dopant gas introduction is called in-situ doping operation in the present disclosure.

In operation 205, the temperature is elevated to a second temperature greater than the first temperature. For example, the operation forming a lightly-doped drain (LDD) in the stripes 302 is usually processed at a temperature greater than about 700 degrees Celsius; and the source/drain annealing is usually processed at a temperature greater than about 1100 degrees Celsius. Under such high temperatures, un-doped silicon layer will recrystallize at various locations including at the interfaces 305a and 305b between the gate oxide material 303 and the silicon layer 304.

Figure 3G:
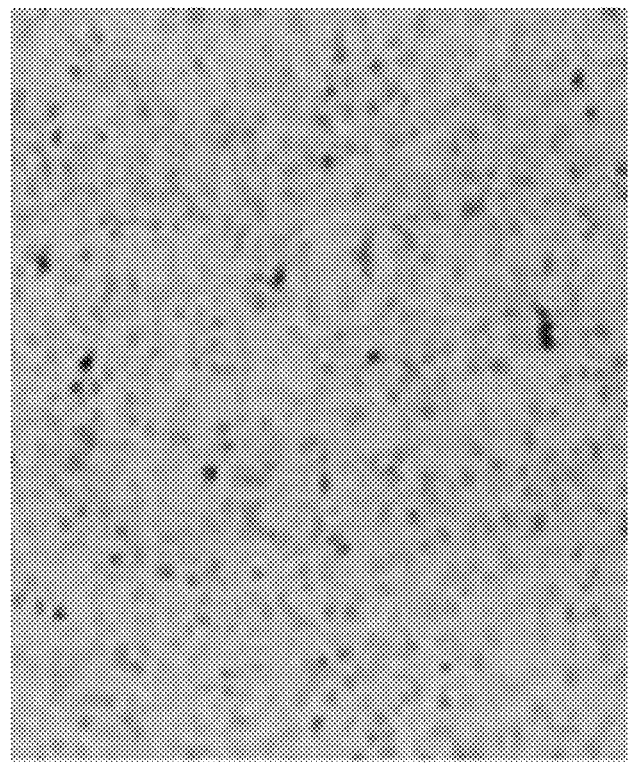
FIG. 3G is a cross sectional view of an in-situ carbon-doped polysilicon gate after an anneal operation, in accordance with some embodiments of the present disclosure.
Figure 3F:
FIG. 3F is a cross sectional view of conventional polysilicon gate after an anneal operation.

FIG. 3F is a cross sectional view of the interfaces 305a and/or 305b within the dotted lines in FIG. 3E. FIG. 3F shows a conventional polysilicon gate without carbon doping after an annealing operation. The recrystallized silicon grains are formed at the interfaces 305a and/or 305b between the gate oxide 303 and the silicon layer 304. FIG. 3G shows a cross sectional view of an in-situ carbon-doped polysilicon gate after an anneal operation, in accordance with some embodiments of the present disclosure. The recrystallized grains of the carbon-doped silicon are much smaller than those of the conventional non-carbon-doped silicon layer as shown in FIG. 3F.

During an annealing operation subsequent to the formation of the silicon layer 304 over the gate oxide 303, polysilicon grains having different sizes and different orientations may be formed at random locations including the interfaces 305a and/or 305b between the gate oxide 303 and the silicon layer 304. In some embodiments, the polysilicon grains may include orientations of <100>, <110> and <111>. FIG. 3F shows a microstructure after an annealing operation at the interfaces 305a and/or 305b between the gate oxide 303 and the silicon layer 304 enclosed by the dotted lines in FIG. 3E. The sizes and orientations of grains shown in FIG. 3F can be different. In some embodiments, the polysilicon grains shown in FIG. 3F include an orientation of <111>. FIG. 3G shows a microstructure after an annealing operation at the interfaces 305a and/or 305b between the gate oxide 303 and the silicon layer 304 enclosed by the dotted lines in FIG. 3E. In some embodiments, the polysilicon grains shown in FIG. 3G include an orientation of <111>. It is understood that the grain size of the in-situ carbon-doped silicon layer is generally smaller than the grain size of the silicon layer without carbon doping, therefore, the <111> grain in the in-situ carbon-doped silicon layer is generally smaller than the <111> grain in the silicon layer without carbon doping. Hence, the <111> grain size formed at the interfaces 305a and/or 305b between the gate oxide 303 and the in-situ carbon-doped silicon layer 304 can be reduced by introducing carbon impurities into the silicon layer 304. In some embodiments, an average <111> grain size in the in-situ carbon-doped silicon layer about 0.02~0.07 μm.

Figures 4A, 4B:
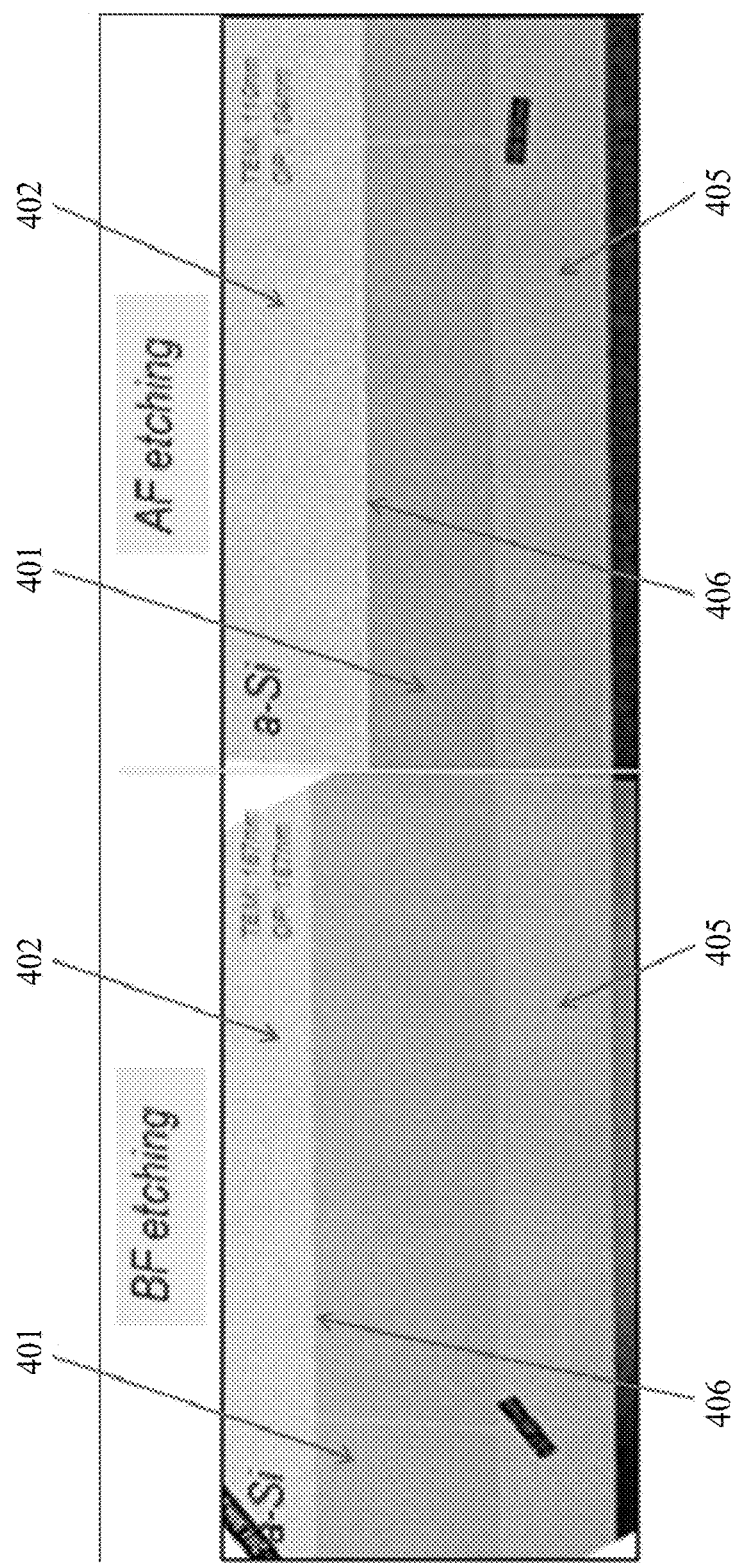
FIG. 4A shows a cross sectional view of a non-annealed amorphous silicon before an etching operation.
FIG. 4B shows a cross sectional view of a non-annealed amorphous silicon after an etching operation.

Because the crystal structures of the grains are different, the grains of different orientations may have different resistant to different kinds of etchants. In some embodiments, the grains of the recrystallized silicon include at least the orientations of <100>, <110> and <111>. To remove the grains at the interfaces 305a and/or 305b between the gate oxide 303 and the silicon layer 304, one or more etchants can be applied. In some embodiments, the etchant may include Ammonium Hydroxide ($NH_4OH$). In some embodiments, under a wet etching with etchant $NH_4OH:H_2O$ (3.7 wt % of $NH_4OH$) and an etching temperature of 40 degrees Celsius, the relative etching rates of polysilicon grains of orientations <100>, <110> and <111> are respectively 100, 37 and 3. After the etching operation, grains with orientation <111> may remain while grains with orientations <100>, <110> being removed. The remained <111> grains may cause great roughness between the metal gate and the gate oxide. This may lead to greater leakage current in the FinFET device with metal gate and cause the yield of the FinFET device to be unacceptable. By adopting the in-situ carbon-doped silicon layer as previously discussed, an average grain size of the <111> poly silicon is effectively decreased to be lower than a predetermined value, and thus the small <111> grains are prone to be removed compared to the large <111> grains as a result of no carbon doping Now referring to FIGS. 4A-4D. FIG. 4A shows a cross sectional view of a non-annealed amorphous silicon before an etching operation. An amorphous silicon layer 401 is sandwiched by an upper coating 402 and a lower coating 405. FIG. 4B shows a cross sectional view of a non-annealed amorphous silicon after an etching operation. After etching, the amorphous silicon layer 401 sandwiched by the upper coating 402 and the lower coating 405 in FIG. 4B is obviously thinner than that in FIG. 4A. The upper interface 406 between the amorphous silicon layer 401 and the upper coating 402 is still smooth. FIG. 4C shows a cross sectional view of polysilicon (annealed amorphous silicon) before an etching operation. After the anneal operation, polysilicon grains 403 are formed in the amorphous silicon layer 401. FIG. 4D shows a cross sectional view of polysilicon (annealed amorphous silicon) after an etching operation. Polysilicon grains 404 having different sizes may be formed. The etching operation is a wet etching with etchant $NH_4OH:H_2O$ (volume ratio 5:1) under an etching temperature of about 50 degrees Celsius. After the etching operation, due to the incomplete removal of the <111> grains, the upper interface 406 between the amorphous silicon layer 401 and the upper coating 402 is rougher compared to the interface 406 as shown in FIG. 4B.

Figure 5:
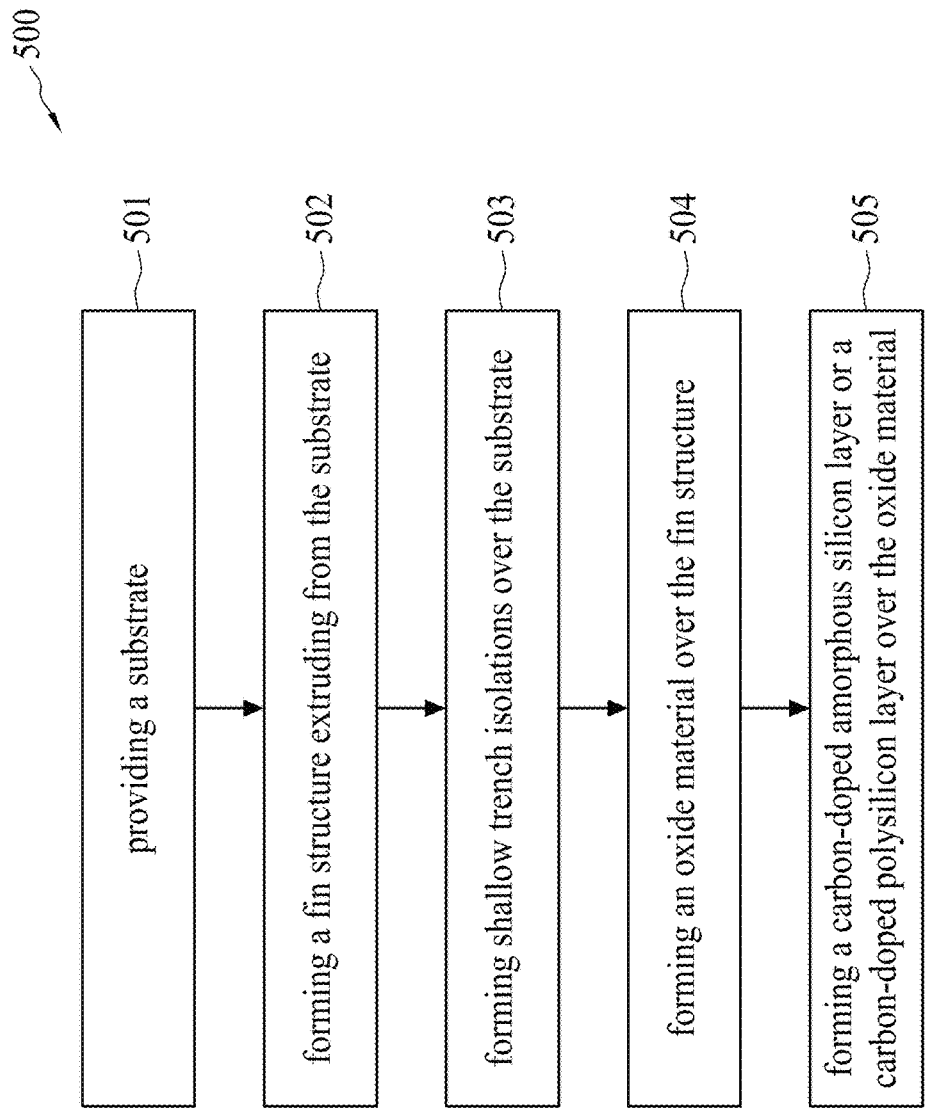
FIG. 5 is a flow chart of forming a FinFET structure in accordance with some embodiments of the present disclosure.
Figure 6C:
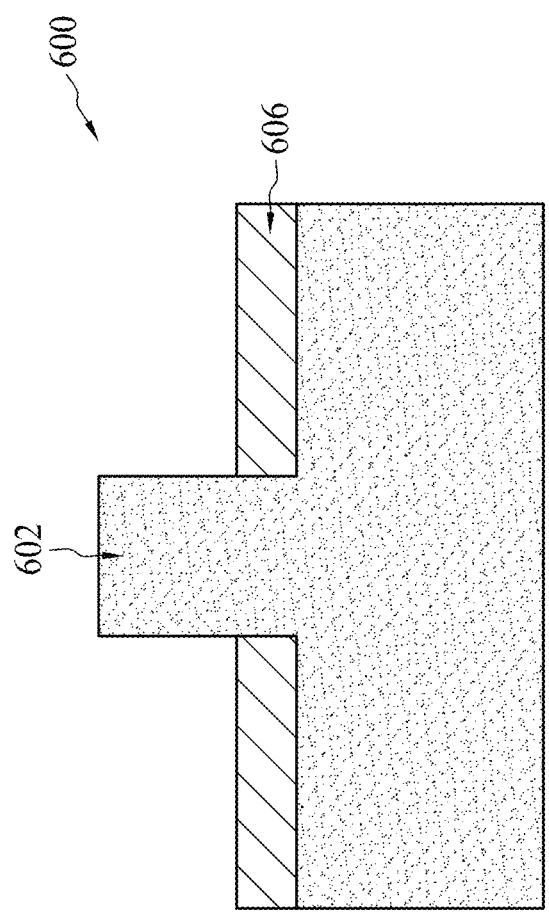
Figure 6D:
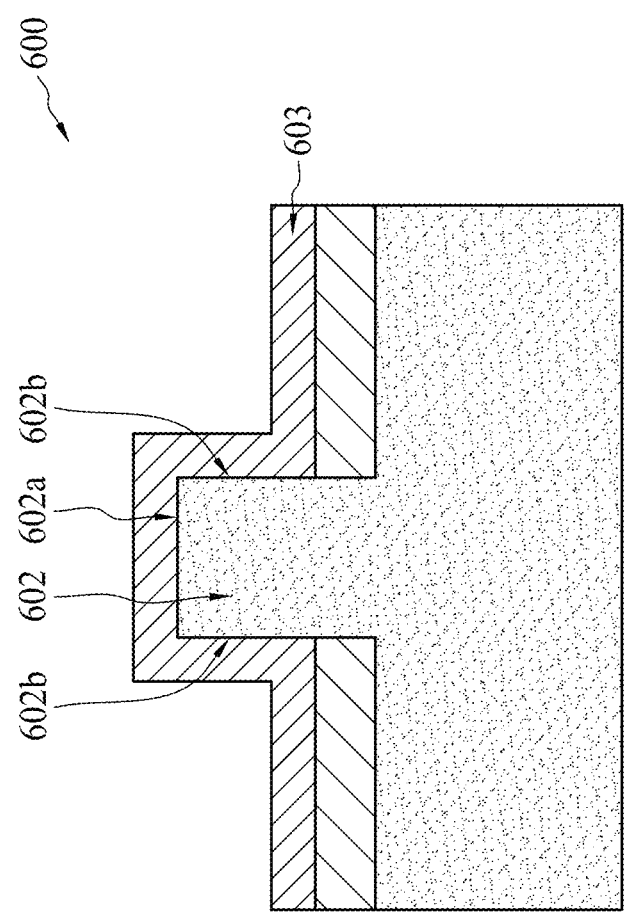

FIG. 5 shows a flow chart of a method 500 of forming a carbon-doped amorphous silicon layer or a carbon-doped polysilicon layer in the process of forming a FinFET device. The method 500 includes a number of operations. Referring to FIG. 5 to FIG. 6D, in operation 501, a substrate 601 is provided as in FIG. 6A. In some embodiments, the substrate comprises silicon. In operation 502, a fin structure extruding from the substrate 601 is formed as shown in FIG. 6B. In some embodiments, material of the fin structure 602 can be the same as that of the substrate 601. In operation 503, isolation structures such as a shallow trench isolation are formed over the substrate 601 as shown in FIG. 6C. FIG. 6C is a cross-sectional view illustrating in detail the FinFET structure 600 of FIG. 6B, wherein the exemplary cross-sectional view is obtained by dissecting along line B-B' in FIG. 6B. The FinFET structure 600 includes a substrate 601 and a fin structure 602. Isolations 606 are formed over the substrate 601, as shown in FIG. 6C. In operation 504, an oxide material 603 is formed over a top surface 602a and a sidewall 602b of the fin structure 602, as shown in FIG. 6D.

Figure 6E:
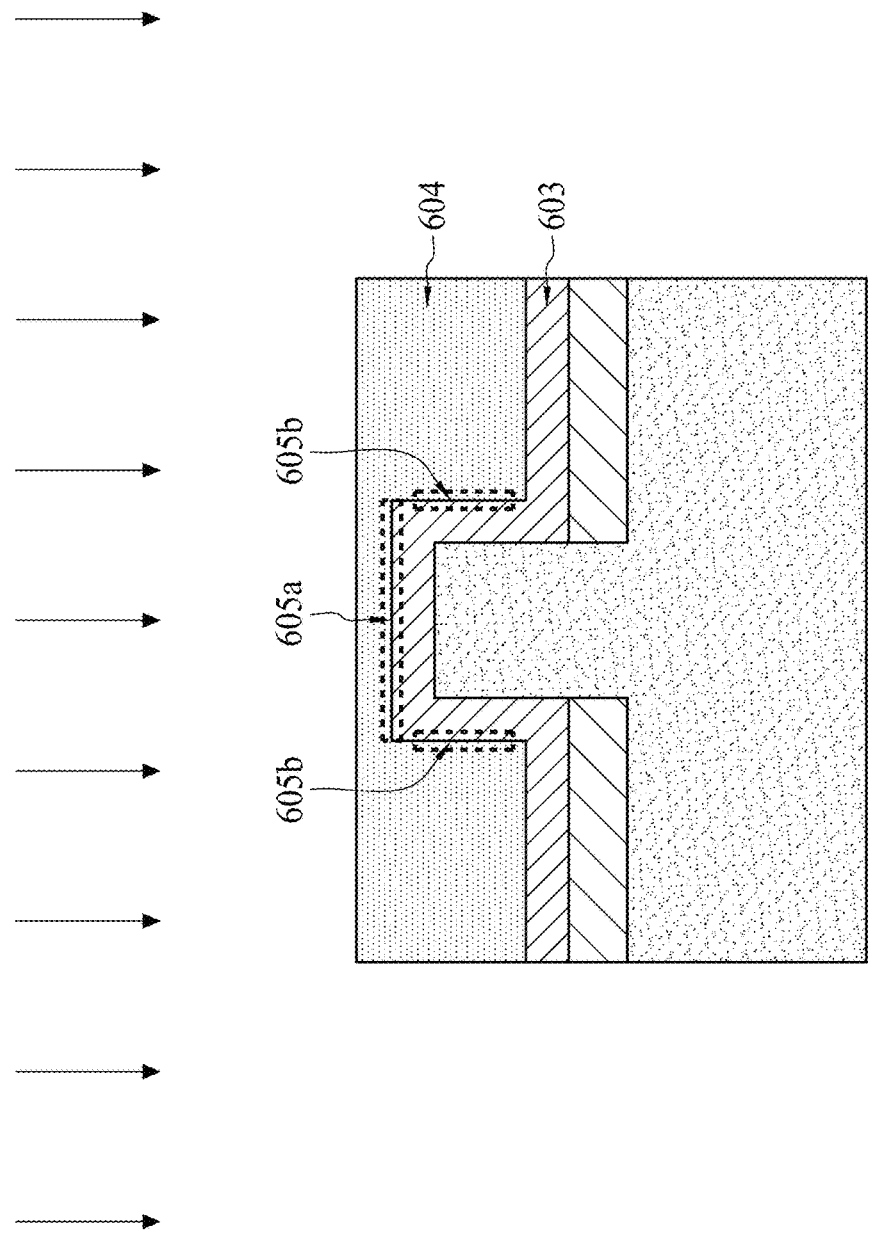
FIG. 6E is a cross sectional view of an in-situ carbon-doped polysilicon gate after an anneal operation, in accordance with some embodiments of the present disclosure.
Figure 6F:
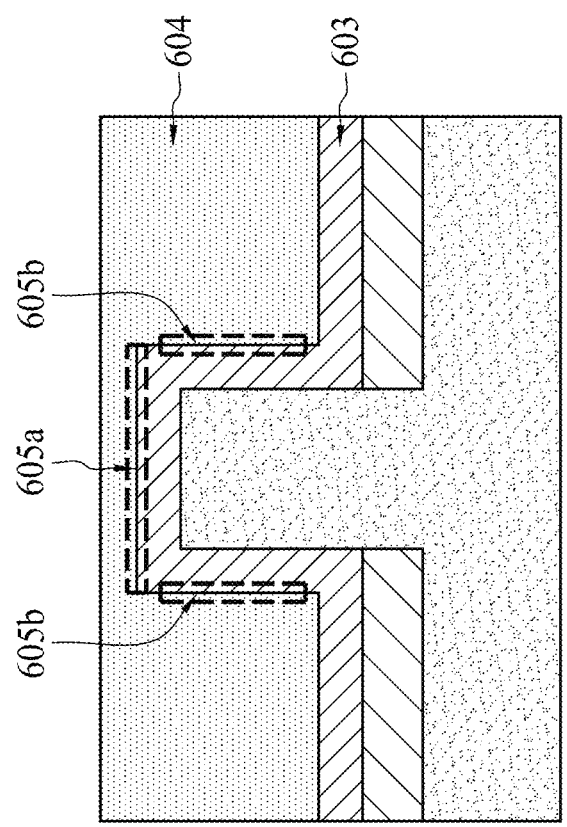
FIG. 6F is a cross sectional view of an ex-situ carbon-doped silicon gate before an implant operation, in accordance with some embodiments of the present disclosure.

In operation 505, a carbon-doped silicon layer 604 is formed over the oxide material 603 and the stripes 602 as shown in FIG. 6E. Now referring to FIGS. 6A-6E. In some embodiments, the carbon-doped silicon layer 604 may be a carbon-doped amorphous silicon layer or a carbon-doped polysilicon layer. The carbon-doped poly silicon layer can be transformed from the carbon-doped amorphous silicon layer under a temperature greater than about 700 degrees Celsius in a subsequent high temperature operation. During the formation of the carbon-doped silicon layer 604, the carbon-doped silicon layer 604 is implanted with carbon atoms at a concentration of from about $5E19/cm^3$ to about $1E22/cm^3$. If the concentration of the carbon atoms increases, the carbon atoms will be more uniformly doped in the silicon layer.

In some embodiments, the carbon-doped silicon layer 604 is formed under a first temperature from about 450 degrees Celsius to about 650 degrees Celsius, typically from 480 degrees Celsius to 620 degrees Celsius. In some embodiments, the carbon-doped silicon layer 604 is formed under a pressure from about 0.2 torr to about 5.0 torr. Gases comprising $SiH_4$, $C_2H_4$ or $H_2$ are also introduced during the formation of the carbon-doped silicon layer 604. The doping operation of the silicon layer being formed concurrently with dopant gas introduction is called in-situ doping operation in the present disclosure. The cross sectional view at the interfaces 605a or 605b enclosed by the dotted lines in FIG. 6E may be substantially the same as those shown in FIG. 3G.

In an electronic circuit, the in-situ doping is applied to FinFET devices that receive the input/output (I/O) power of the electronic circuit. In some embodiments, the I/O devices receive greater power compared to other devices in the electronic circuit. In some embodiments, the above-mentioned in-situ doping operation can be used to manufacture the devices in the I/O region of an electronic circuit.

Figure 6G:
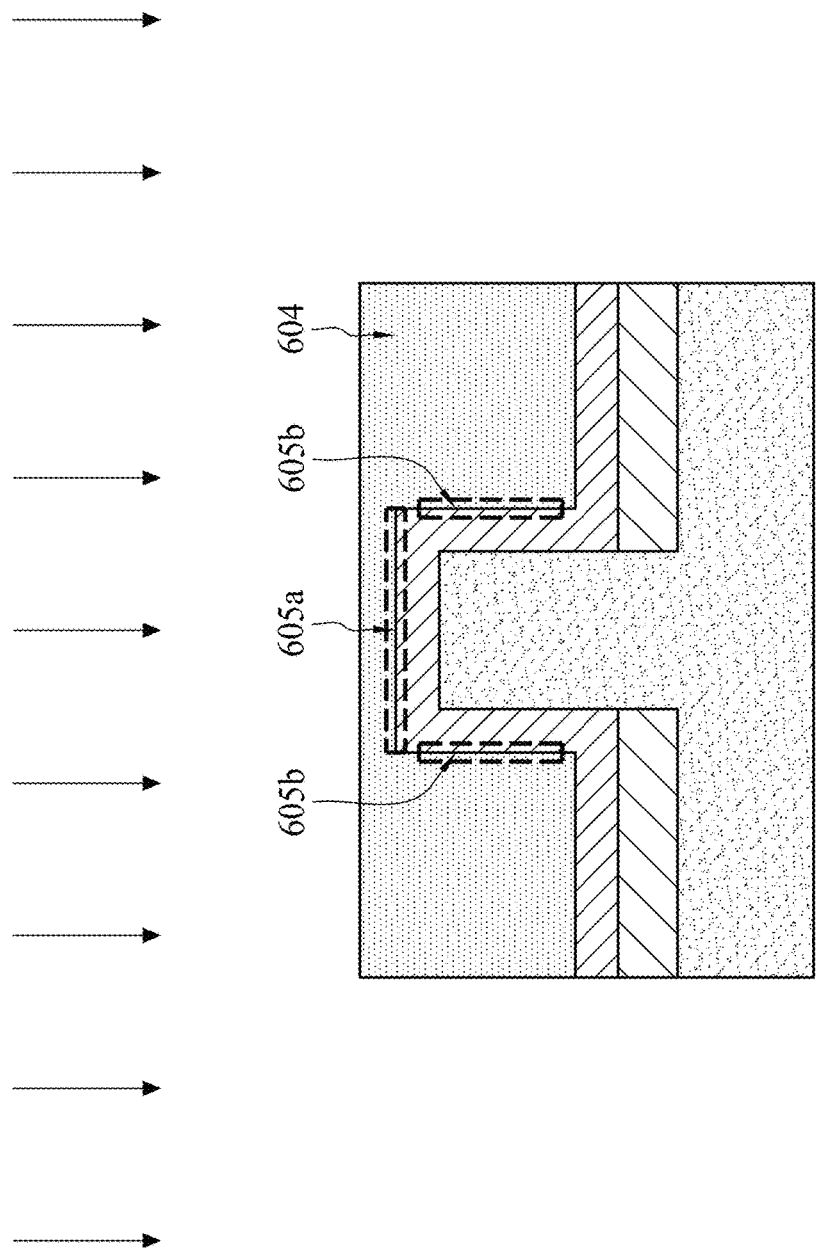
FIG. 6G is a cross sectional view of an ex-situ carbon-doped polysilicon gate after an implant operation, in accordance with some embodiments of the present disclosure.

Now referring from FIGS. 6A-6D, 6F and 6G. The flows of forming the structure of FIGS. 6A-6D have been discussed previously. For simplicity, the flows of forming the structure of FIGS. 6A-6D are not repeated again here. In some embodiments, after the oxide material 603 is formed over the fin structure 602 and the isolations 606, as shown in FIG. 6D, the silicon layer 604 is then formed on the oxide material 603 as in FIG. 6F. Subsequent to the formation of the silicon layer 604, the silicon layer 604 is implanted with carbon and/or nitrogen at a concentration of from about $5E19/cm^3$ to about $1E22/cm^3$ as shown in FIG. 6G. In some embodiments, the silicon layer 604 is annealed under a temperature of from about 700 degrees Celsius to about 900 degrees Celsius for about 10 to about 60 minutes. In some embodiments, the silicon layer 604 is annealed under an ambient of nitrogen. The implant operation of carbon and/or nitrogen is performed after the formation of the silicon layer 604. Such operation is called ex-situ doping operation in the present disclosure.

Figure 6H:
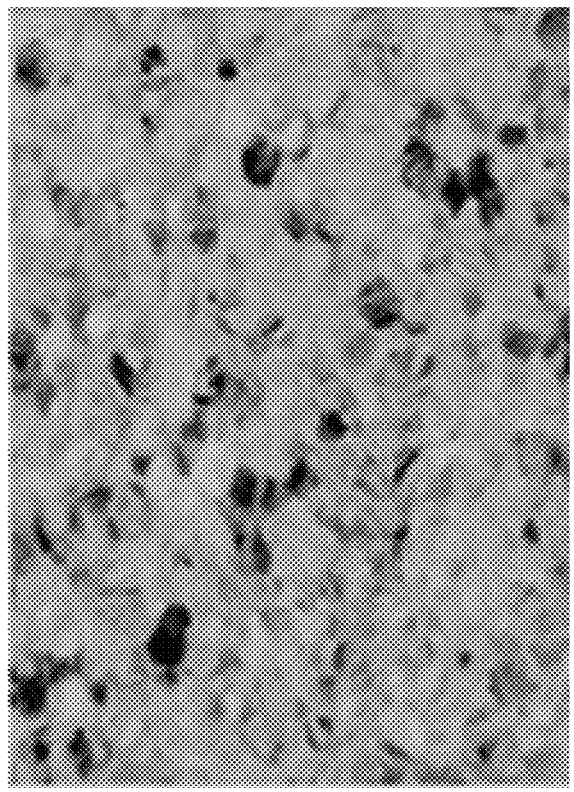
FIG. 6H is a cross sectional view of an ex-situ carbon-doped polysilicon gate after an anneal operation, in accordance with some embodiments of the present disclosure.

FIG. 6H shows a cross sectional view of an ex-situ carbon-doped polysilicon gate after an anneal operation, in accordance with some embodiments of the present disclosure. The recrystallized grains of the carbon-doped silicon are smaller than those of the conventional non-doped silicon layer. In some embodiments, the recrystallized grains of the ex-situ carbon-doped silicon may be larger than those of the in-situ carbon-doped silicon layer.

In an electronic circuit, the ex-situ doping is applied to FinFET devices that receive the input/output (I/O) power of the electronic circuit. In some embodiments, the I/O devices receive greater power compared to other devices in the electronic circuit. In some embodiments, the above-mentioned ex-situ doping operation can be used to manufacture the devices in the I/O region of an electronic circuit.

Now referring to FIGS. 6A-6E, and FIG. 6G. In some embodiments, FIGS. 6A-6E shows cross sectional views of forming an in-situ carbon-doped silicon layer in a FinFET structure. However, in some embodiments, the in-situ carbon-doped silicon layer is further ex-situ doped with carbon and/or nitrogen atoms, as shown in FIG. 6G, so as to reach a dopant concentration of from about $5E19/cm^3$ to about 1E22/cm$^3$. In an electronic circuit, the in-situ doping, the ex-situ doping or a combination thereof can be applied to form FinFET devices. In some embodiments, the above-mentioned in-situ and ex-situ doping operation can be used to manufacture the devices in the I/O region of an electronic circuit.

Figure 7:
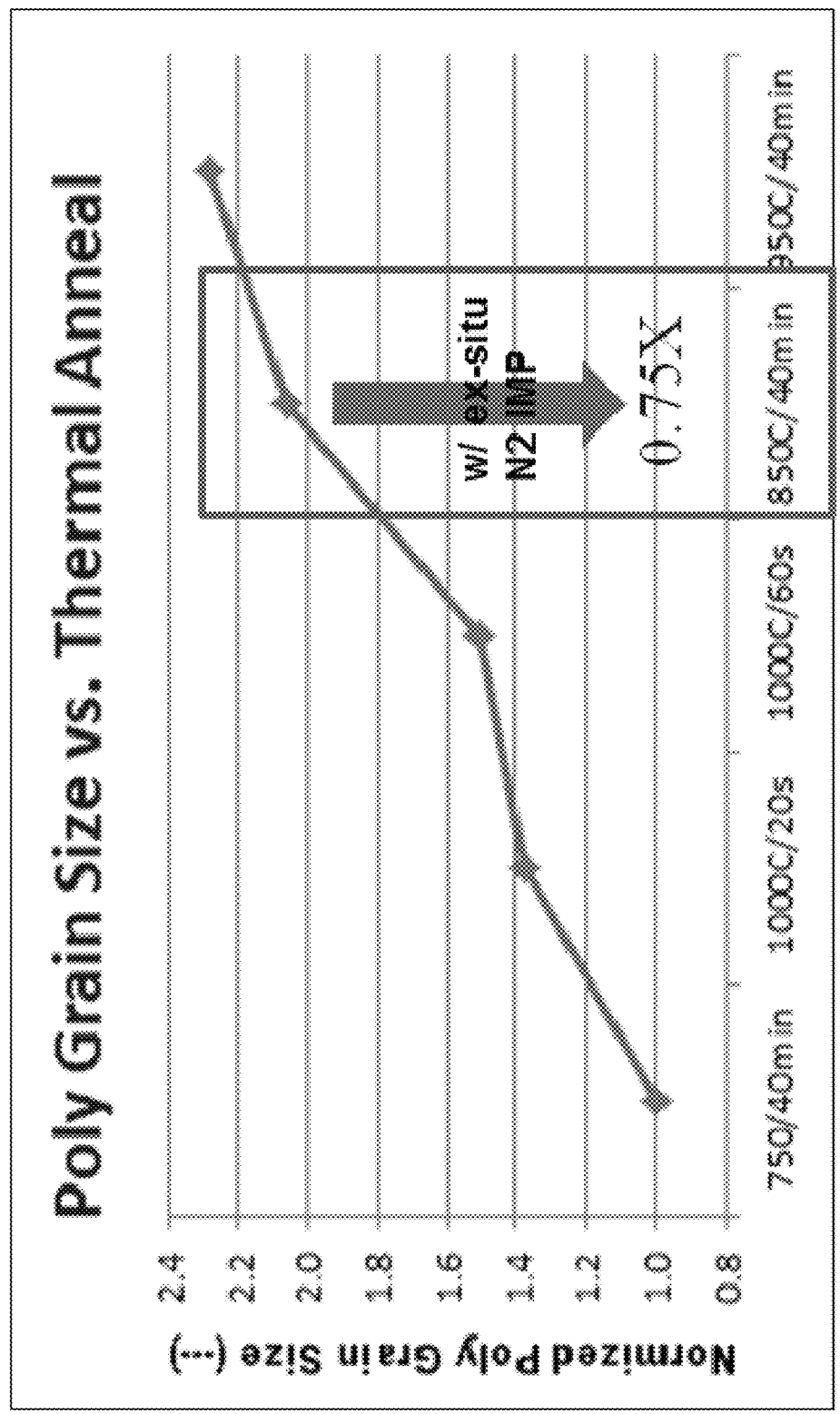
FIG. 7 represents the normalized poly grain size with respect to various thermal anneal conditions.

FIG. 7 represents the normalized poly grain size with respect to various thermal anneal conditions. As the temperatures of the processes increase, the normalized poly grain size increase. As the times which the processes take increase, the normalized poly grain sizes also increase. Under an ex-situ nitrogen doping condition of 850 degrees Celsius for 40 minutes, a grain size of the ex-situ carbon-doped poly silicon layer is 75% of a grain size of a poly silicon layer without carbon (e.g. a normalized grain size may decrease from about 2.1 to about 1.6). The implant operation of carbon and/or nitrogen into the silicon layer 604 can restrain the grains from recrystallization at the interfaces 605a and/or 605b between the gate oxide 603 and the silicon layer 604.

There may be two problems during the formation of the silicon layer 604 in the FinFET structure. The first problem is that grains with orientation <111> may be formed. It is known that grains with orientation <111> have the lowest etching rate when etched by a wet etchant NH$_4$OH:H$_2$O (3.7 wt % of NH$_4$OH) under an etching temperature of 40 degrees Celsius. After an etching operation of removing the grains at the interfaces 605a and/or 605b, the <111> grains may not be removed completely. Referring back to FIGS. 4C and 4D, silicon grains 404 with orientation <111> are formed and the incomplete removal of the <111> grains can occur during the formation of the FinFET structure. For example, the operation of replacing a polysilicon gate with a metal gate involves an etching operation of the polysilicon layer. The <111> grain in the polysilicon layer may prevent the complete removal of the polysilicon grains and result to a rough etching interface in proximity to the gate oxide. The interface between the subsequently formed metal gate and the gate oxide would not only be rough but also separated by the unremoved polysilicon grains. Because the roughness of the interfaces 605a or 605b between the gate oxide 603 and the metal gate may lead to greater leakage current in the FinFET device with the metal gate, the performance of a FinFET device may be degraded. Therefore, if the polysilicon grain sizes are controlled to be smaller, the <111> grain is easier to be removed and thus less left-over polysilicon after the etching operation performed during gate replacement. To overcome the issue caused by the <111> grains at the interfaces 605a and/or 605b between the gate oxide 603 and the silicon layer 604, an in-situ and/or ex-situ doping with carbon and/or nitrogen may be applied to decrease the grain sizes.

In addition to the above-discussed impact of the roughness and incomplete removal of the polysilicon layer at the interfaces 605a and/or 605b between the gate oxide 603 and the silicon layer 604 of the FinFET device, the volume expansion of the grain growth during recrystallization at the interfaces 605a and/or 605b between the gate oxide 603 and the metal gate is also a yield killer for FinFET devices because the roughness at the interfaces 605a and/or 605b is further enhanced as a result of the mechanical deformation.

Figure 8A:
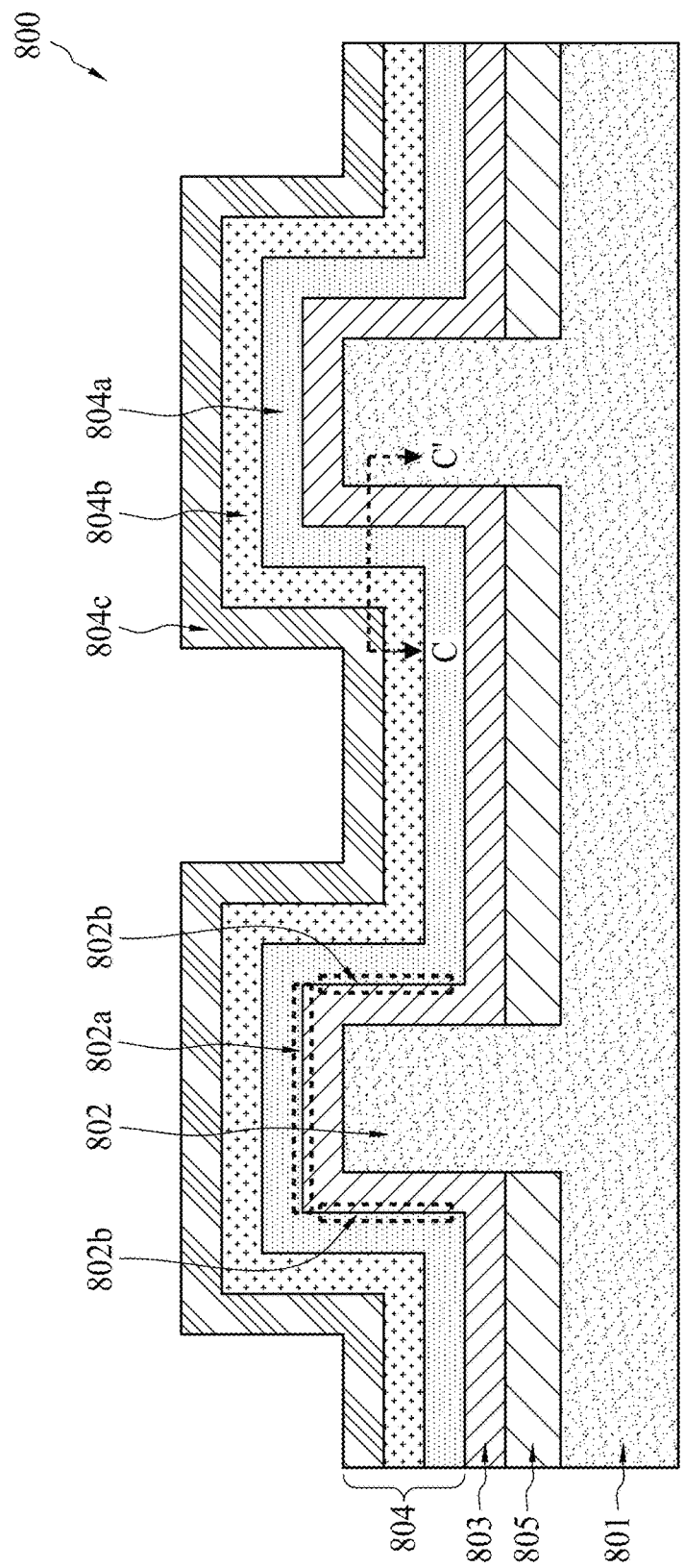
FIG. 8A is a FinFET structure with a metal gate in accordance with some embodiments of the present disclosure.

Referring to FIG. 8A, a metal layer 804 is formed on a gate oxide material 803. FIG. 8A is a cross sectional view of a FinFET structure 800 with a metal gate 804. The FinFET structure 800 includes a substrate 801, a plurality of stripes 802 on the substrate 801, and a metal gate 804 on a sidewall 802b and a top surface 802a of one of the plurality of stripes 802. The isolations 805 are formed over the substrate 801. The FinFET structure further includes the oxide material 803 between the metal gate 804 and the plurality of stripes 802. The thickness of the oxide material 803 is from about 1 to about 4 nm.

Still referring to FIG. 8A, after removing the carbon-doped silicon layer with an etching operation, grains at the interfaces 802a and/or 802b between the silicon layer and the oxide material 803 may be nearly completely removed. A metal gate 804 is then formed on the oxide material 803. Thus the interfaces 802a and/or 802b between the metal gate 804 and the oxide material 803 do not include unremoved polysilicon. In addition, a volume expansion of the silicon grains during recrystallization may cause the oxide material 803 to deform. A metal gate 804 is then formed on the oxide material 803. The roughness of the interface between the metal gate 804 and the oxide material 803 may be carried to the final product of the FinFET structure 800. In some embodiments, the carbon-doped silicon layer undergoes less recrystallization growth and thus the volume expansion of the silicon grain is not as great as that in a silicon layer without carbon doping. As a result, the roughness at the interface between the metal gate 804 and the oxide material 803 can be effectively reduced.

The metal gate 804 of the FinFET structure 800 may include multiple layers. Referring to FIG. 8A, the metal gate 804 has a tri-layer structure. The tri-layer structure includes a capping layer 804a, a doping layer 804b, and a conductive layer 804c. The doping layer 804b is configured to provide dopants, in some embodiments, aluminum ions, to the conductive layer 804c. The capping layer 804a may include TiN, TaN or other materials. The capping layer 804a is formed on top of the doping layer 804b. The capping layer 804a is formed by various deposition techniques such as ALD, PVD, CVD, PECVD, or other suitable techniques. In some embodiments, the capping layer 804a is an optional layer that can be removed from the tri-layer discussed herein. In FIG. 8A, the metal gate 804 is conformally deposited on a top surface 802a and a sidewall 802b of one of a plurality of stripes 802. The plurality of stripes 802 are separated by isolations 805.

Figure 8B:
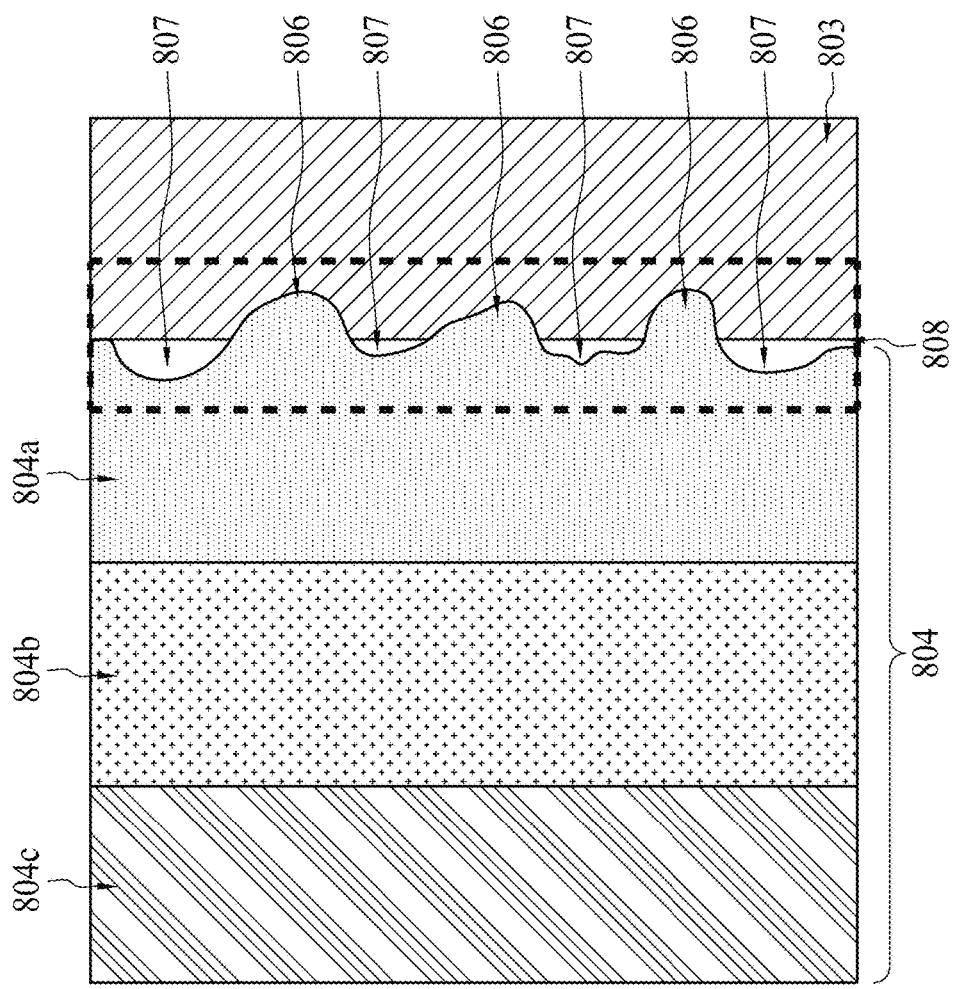
FIG. 8B is a cross sectional view of an interface between a gate oxide and a metal gate of a FinFET structure.

FIG. 8B is a cross-sectional view illustrating in detail the FinFET structure 800 of FIG. 8A, wherein the exemplary cross-sectional view is obtained by dissecting line C-C' in FIG. 8A. FIG. 8B shows that a rough surface is formed between the capping layer 804a of the metal gate 804 and the oxide material 803 under conventional manufacturing method for a FinFET structure, for example, the polysilicon gate is not doped with carbon atoms. The volume expansion of grains during recrystallization at an interface 808 between the capping layer 804a of the metal gate 804 and the oxide material 803 may cause the interface 808 to be deformed. After an etching operation, recesses 806 in the oxide material 803 may be formed. Subsequent to the etching operation, the capping layer 804a of the metal gate 804 is formed on the rough surface of the oxide material 803. The capping layer 804a may be formed in the recesses 806. In some embodiments, the protrusions 807 between the capping layer 804a and the oxide material 803 can be the unremoved polysilicon grains. The recesses 806 and protrusions 807 contribute to the average roughness at the interface 808. Because the shape of the metal gate 804 is undesirably changed, the performance of the FinFET device is deteriorated. In contrast, when using the in-situ doping and/or the ex-situ doping as previously described in the present disclosure, the recrystallized grain size and the volume expansion can be reduced and a smoother interface between the metal gate 804 and the oxide material 803 can be obtained. In some embodiments, the interface 808 between the capping layer 804a of the metal gate 804 and the oxide material 803 may not include any unremoved polysilicon, that is, capping layer 804a is in contact with the oxide materials 803 without being spaced by the unremoved polysilicon. In some embodiments, the average roughness of the interface between the metal gate 804 and the oxide material 803 is in a range of from about 0.1 nm to 0.2 nm. As a result, the performance of the FinFET device can be improved.

In an electronic circuit, the in-situ doping, the ex-situ doping or a combination thereof may be applied to FinFET devices that receive the input/output (I/O) power of the electronic circuit. In some embodiments, the I/O devices receive greater power compared to other devices in the electronic circuit. In some embodiments, the above-mentioned in-situ doping, ex-situ doping or a combination thereof can be used to manufacture the devices in the I/O region of an electronic circuit.

Some embodiments of the present disclosure provide a FinFET structure comprising: a substrate; a plurality of stripes on the substrate; a metal gate on a sidewall and a top surface of one of the plurality of stripes; and an oxide material between the metal gate and the plurality of stripes, wherein an average roughness of an interface between the metal gate and the oxide material is in a range of from about 0.1 nm to about 0.2 nm.

Some embodiments of the present disclosure provide a FinFET structure comprising: a substrate; a plurality of stripes on the substrate; a metal gate on a sidewall and a top surface of one of the plurality of stripes; and an oxide material between the metal gate and the plurality of stripes, wherein an average roughness of an interface between the metal gate and the oxide material is lower than thickness of the oxide material.

Some embodiments of the present disclosure provide a FinFET structure comprising: a substrate; a stripe on the substrate; a metal gate on the stripe; and an oxide material between the metal gate and the stripe, wherein the metal gate is in contact with the oxide material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A FinFET structure, comprising:
a substrate;
a plurality of stripes on the substrate;
a metal gate on a sidewall and a top surface of one of the plurality of stripes; and
an oxide material between the metal gate and the plurality of stripes,
wherein an average roughness of an interface between the metal gate and the oxide material is in a range of from about 0.1 nm to about 0.2 nm.

2. The FinFET structure of claim 1, wherein the FinFET structure is in an I/O region of an electronic circuit.

3. The FinFET structure of claim 1, wherein a thickness of the oxide material is from about 1.0 nm to about 4.0 nm.

4. The FinFET structure of claim 1, wherein the interface between the metal gate and the oxide material does not include polysilicon.

5. The FinFET structure of claim 1, wherein the metal gate is in contact with the oxide material.

6. The FinFET structure of claim 1, wherein the metal gate includes a capping layer on the oxide material, and a doping layer on the capping layer.

7. The FinFET structure of claim 1, further comprising:
an isolation configured to isolate the substrate from the oxide material.

8. The FinFET structure of claim 7, wherein a first stripe of the stripes and a second stripe of the stripes are separated by the isolation.

9. A FinFET structure, comprising:
a substrate;
a plurality of stripes on the substrate;
a metal gate on a sidewall and a top surface of one of the plurality of stripes; and
an oxide material between the metal gate and the plurality of stripes,
wherein an average roughness of an interface between the metal gate and the oxide material is lower than a thickness of the oxide material, and wherein there is a grain with orientation of <111> at the interface between the metal gate and the oxide material, and there are no any grains with orientations of <100> and <110> at the interface.

10. The FinFET structure of claim 9, wherein the average roughness of an interface between the metal gate and the oxide material is in a range of from about 0.1 nm to about 0.2 nm.

11. The FinFET structure of claim 9, wherein the thickness of the oxide material is from about 1.0 nm to about 4.0 nm.

12. The FinFET structure of claim 9, wherein the FinFET structure is in an I/O region of an electronic circuit.

13. The FinFET structure of claim 9, wherein the metal gate includes a capping layer on the oxide material, and a doping layer on the capping layer.

14. The FinFET structure of claim 9, further comprising:
an isolation configured to isolate the substrate from the oxide material.

15. The FinFET structure of claim 14, wherein a first stripe of the stripes and a second stripe of the stripes are separated by the isolation.

16. A FinFET structure, comprising:
a substrate;
a stripe on the substrate;
a metal gate on the stripe; and
an oxide material between the metal gate and the stripe,
wherein the metal gate is in contact with the oxide material, an average roughness of an interface between the metal gate and the oxide material is lower than a thickness of the oxide material, and the average roughness of the interface between the metal gate and the oxide material is in a range of from about 0.1 nm to about 0.2 nm.

17. The FinFET structure of claim 16, wherein the metal gate includes a capping layer on the oxide material, and a doping layer on the capping layer.

18. The FinFET structure of claim 16, wherein there are no any grains at the interface between the metal gate and the oxide material.

19. The FinFET structure of claim 16, wherein there is a grain with orientation of <111> at the interface between the metal gate and the oxide material, and there are no any grains with orientations of <100> and <110> at the interface.

20. The FinFET structure of claim 16, wherein the thickness of the oxide material is from about 1.0 nm to about 4.0 nm.

* * * * *